United States Patent
McClellan et al.

(10) Patent No.: US 7,611,402 B2
(45) Date of Patent: Nov. 3, 2009

(54) APPARATUS FOR COOLING ELECTRONICS

(75) Inventors: Jeffrey R. McClellan, Raleigh, NC (US); Deborah H. Heller, Raleigh, NC (US); James Xavier Torok, Raleigh, NC (US); Dale Krisher, Wake Forest, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 139 days.

(21) Appl. No.: 11/692,393

(22) Filed: Mar. 28, 2007

(65) Prior Publication Data
US 2008/0239661 A1 Oct. 2, 2008

(51) Int. Cl.
H05K 5/00 (2006.01)
G06F 1/20 (2006.01)
H05K 7/20 (2006.01)

(52) U.S. Cl. ............ 454/184; 361/679.48; 361/679.49; 361/695

(58) Field of Classification Search ............ 454/184; 361/695, 679.48, 679.49
See application file for complete search history.

(56) References Cited

U.S. PATENT DOCUMENTS

| | | | | |
|---|---|---|---|---|
| 2,275,572 A | * | 3/1942 | Somers | 285/125.1 |
| 3,354,947 A | * | 11/1967 | McKinnon | 165/50 |
| 5,338,214 A | * | 8/1994 | Steffes et al. | 439/160 |
| 6,206,778 B1 | * | 3/2001 | Smith | 454/292 |
| 6,330,154 B1 | * | 12/2001 | Fryers et al. | 361/695 |
| 6,341,064 B1 | * | 1/2002 | Bradley | 361/695 |
| 6,400,568 B1 | * | 6/2002 | Kim et al. | 361/697 |
| 6,464,578 B1 | * | 10/2002 | Chin et al. | 454/184 |
| 6,504,718 B2 | * | 1/2003 | Wu | 361/695 |
| 6,508,076 B1 | * | 1/2003 | Gast et al. | 62/408 |
| 6,508,702 B1 | * | 1/2003 | Fabiano et al. | 454/138 |
| 6,643,131 B1 | * | 11/2003 | Huang | 361/697 |
| 6,678,157 B1 | * | 1/2004 | Bestwick | 361/695 |
| 7,016,193 B1 | | 3/2006 | Jacques et al. | |
| 2004/0004812 A1 | * | 1/2004 | Curlee et al. | 361/687 |
| 2004/0174677 A1 | * | 9/2004 | Chang | 361/695 |
| 2004/0196629 A1 | * | 10/2004 | Broder et al. | 361/695 |
| 2006/0023420 A1 | * | 2/2006 | Tucker et al. | 361/695 |
| 2006/0181846 A1 | * | 8/2006 | Farnsworth et al. | 361/695 |

* cited by examiner

*Primary Examiner*—Steven B McAllister
*Assistant Examiner*—Patrick F. O'Reilly, III
(74) *Attorney, Agent, or Firm*—Fogg & Powers LLC

(57) ABSTRACT

An apparatus for guiding air through electronic components is disclosed. The apparatus has an intake, a transition portion, and a focused egress. The transition portion is connected to the intake and defines a channel. The channel has a generally 'u' shaped cross-section and a first edge and a second edge configured to be positioned substantially opposing a surface. The focused egress is connected to the transition portion.

23 Claims, 7 Drawing Sheets

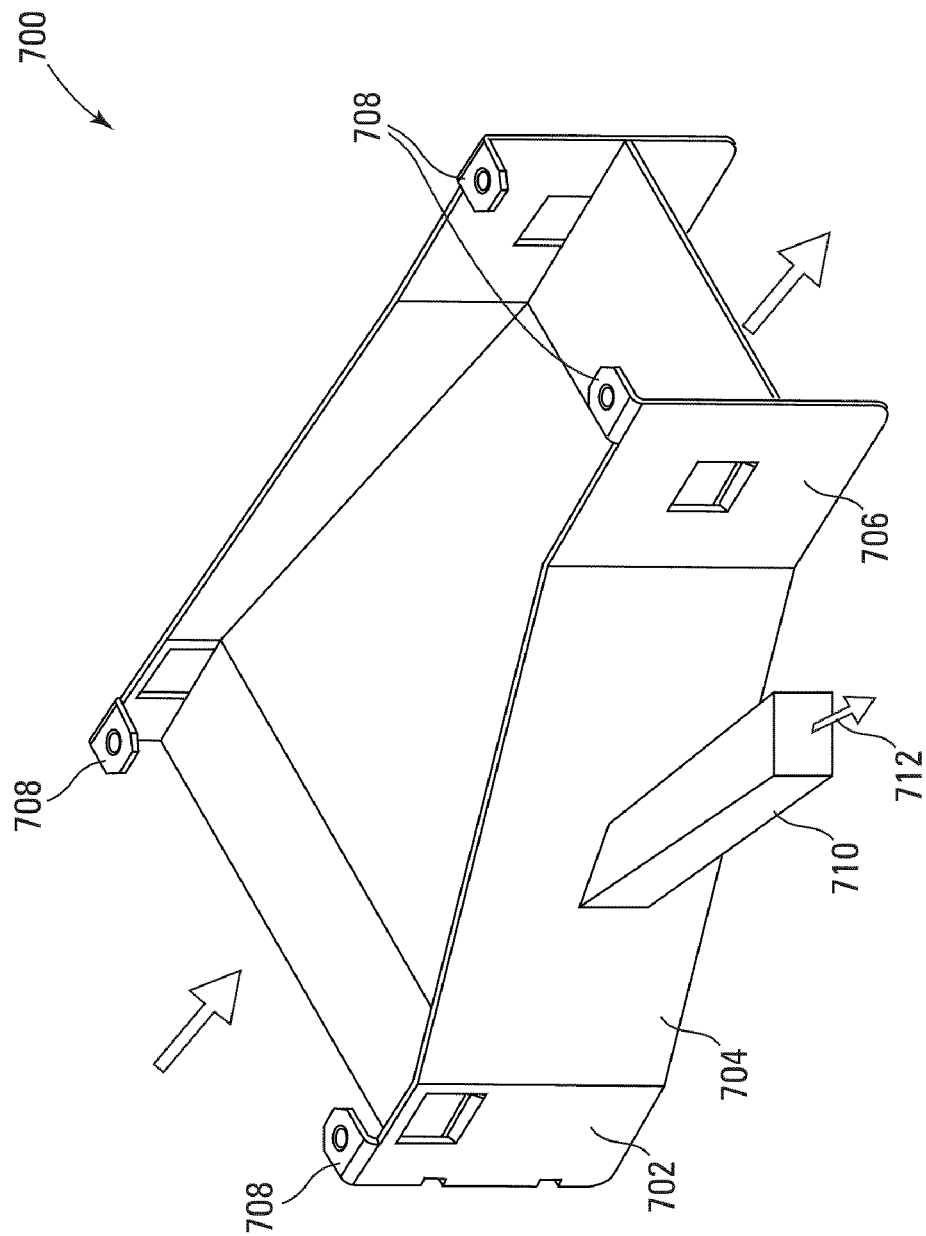

APPARATUS FOR COOLING ELECTRONICS

RELATED APPLICATIONS

This application is related to the following commonly assigned applications filed on Mar. 28, 2007, each of which is hereby incorporated herein by reference:

U.S. patent application Ser. No. 11/692,449, entitled "PROGRAMMABLE HIGH SPEED CROSSBAR SWITCH" (the '813 Application);

U.S. patent application Ser. No. 11/692,368, entitled "FAN MODULE" (the '816 Application); and U.S. patent application Ser. No. 11/692,436, entitled "FILTER ASSEMBLY" (the '818 Application).

BACKGROUND

Dissipating heat away from circuit board components is a major design concern for almost all electronic devices. Often, circuit board components are cooled by causing air to flow past the component. The amount of heat dissipated from the component as a result of air cooling is a factor of the area of surface on the component from which heat can dissipate, and the amount of air that passes across that surface. If the electronic components operate in a device that is stationary, fans are usually installed to increase the air flow across the components.

Some electronic chips produce a large amount of heat and have very small dimensions, leaving a small heat dissipation surface area. To increase the surface area available to dissipate heat, a heat sink is often attached to these types of electronic chips. Heat sinks are generally made of metal and are coupled directly to the core of the chip, which is the main heat producing area of the chip. A heat sink extends from the core of the chip outward and has numerous outward projecting fins. Since the heat sink is coupled to the core of the chip, heat created by the chip flows out into the fins of the heat sink. The fins have a large surface area and effectively increase the surface area of heat dissipation for the chip.

Along with increasing the heat dissipating surface area, increasing the amount of air that flows across a chip can also increase the heat dissipation from the chip. In a stationary device this is usually accomplished by selecting a fan or group of fans of a certain size and having a sufficient volumetric air flow. The volume of air and the amount of dissipating surface area combine to dissipate heat from the device.

For the reasons stated above, and for other reasons stated below which will become apparent to those skilled in the art upon reading and understanding the present specification, there is a need in the art for an effective mechanism to cool electronics.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention. In one embodiment, an apparatus for guiding air to electronic components is disclosed. The apparatus has an intake, a transition portion, and a focused egress. The transition portion is connected to the intake and defines a channel. The channel has a generally 'u' shaped cross-section and a first edge and a second edge configured to be positioned substantially opposing a surface. The focused egress is connected to the transition portion.

BRIEF DESCRIPTION OF THE DRAWINGS

The present invention can be more easily understood and further advantages and uses thereof more readily apparent, when considered in view of the detailed description and the following figures in which:

FIG. 7 is a perspective view of another embodiment of an air guide.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings that form a part hereof, and in which is shown by way of illustration specific illustrative embodiments in which the device may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present apparatus is an air guide that improves air flow through an electronic device. The air guide has an intake, a transition portion, and a focused egress. The air guide is installed such that moving air is received in the intake of the air guide. From the intake, the air flow is focused through the transition portion and released at the focused egress to flow through a heat sink. The air guide has a general 'u' shaped cross-section and is installed so that the open face of the 'u' opposes a circuit board. Thus, the circuit board acts to partially close the 'u' shape and direct the air flow through the transition portion of the air guide. The air guide is installed such that there is a gap between the edges of the 'u' shape and the circuit board. Thus, some of the air flow is allowed to escape from the transition portion of the air guide and flow over additional electronic components. Further detail is provided below in reference to FIGS. 1-7.

Figure 1:
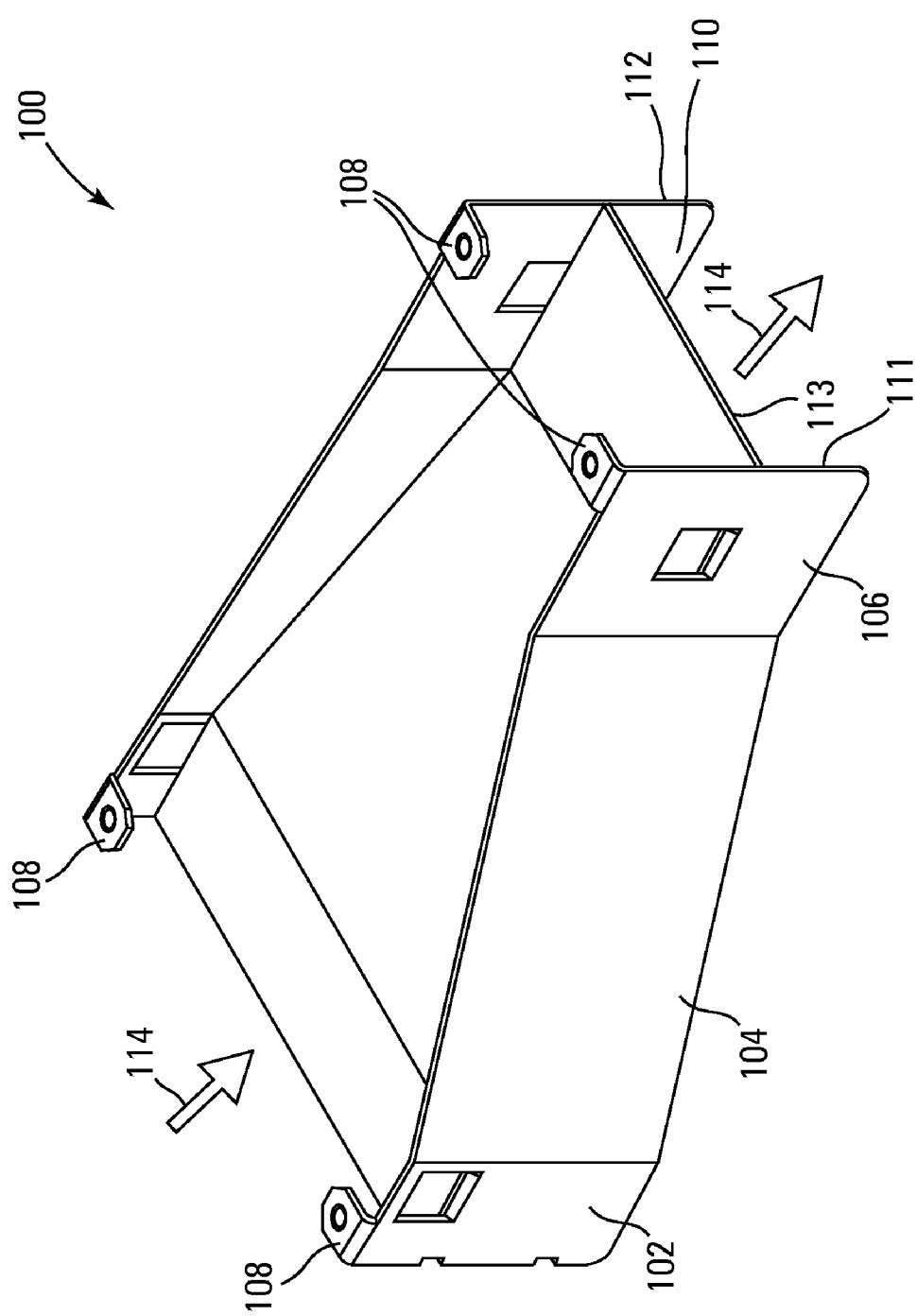
FIG. 1 is a perspective view of one embodiment of an air guide.
Figure 2:
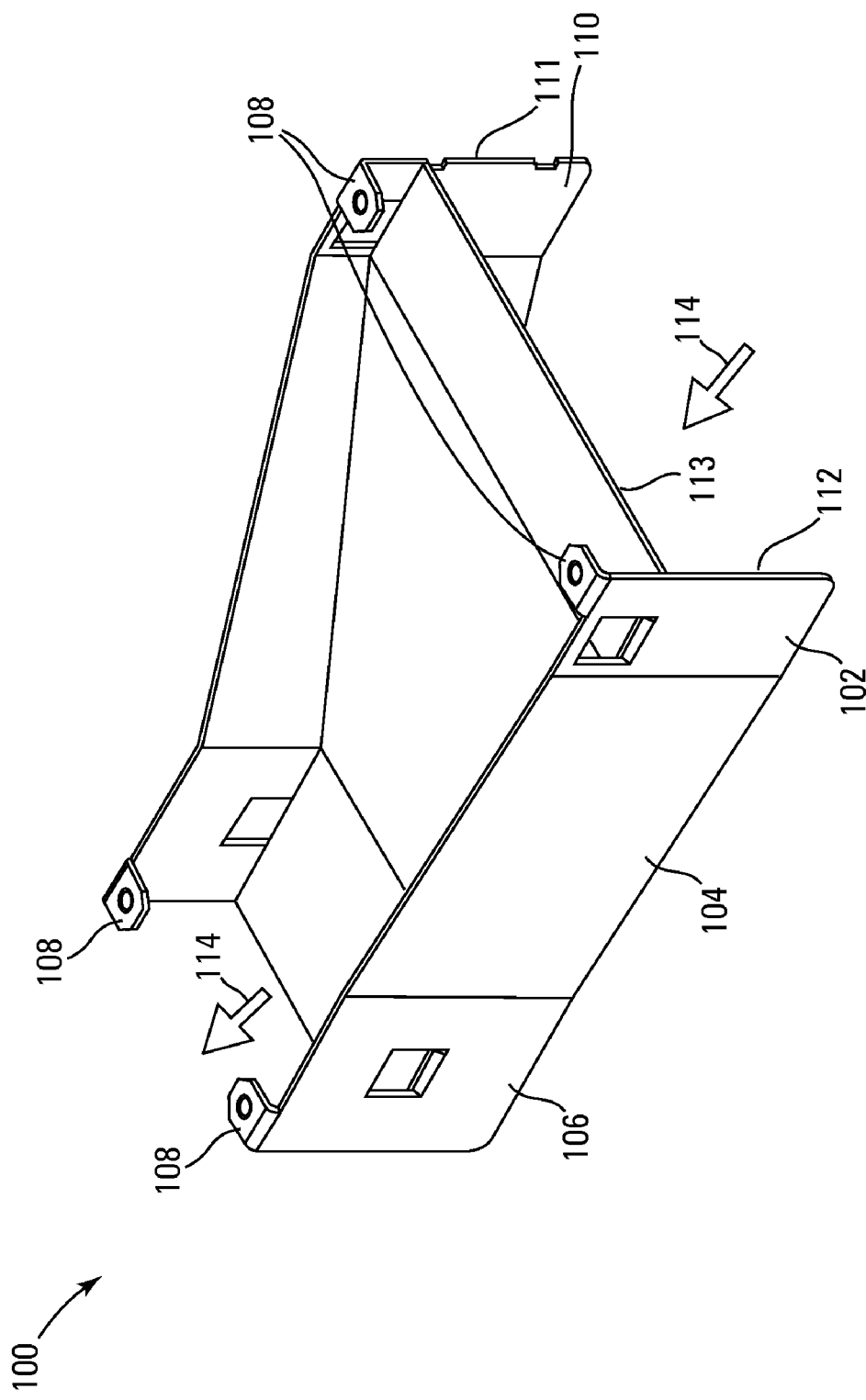
FIG. 2 is another perspective view of the air guide of FIG. 1.

FIGS. 1 and 2 illustrate perspective views of one embodiment of an air guide 100. Air guide 100 is a contiguous unit made up of an intake 102, a transition portion 104 connected to intake 102, and a focused egress 106 connected to an opposite side of transition portion 104. In this embodiment, air guide 100 defines a channel 110 having an inverted, generally 'u' shaped cross-section. Channel 110 is defined by first side 111, second side 112 and top 113. In this embodiment, first side 111, second side 112, and top 113 intersect at substantially right angles forming a rectangular 'u' shape. In another embodiment, channel 110 has a generally cylindrical 'u' shape.

In this embodiment, air guide 100 is asymmetric in that the openings formed by intake 102 and focused egress 106 are not centered with each other. In another embodiment, air guide 100 is symmetric such that transition portion 104 evenly slopes in from intake 102 to focused egress 106. Air guide 100 also has attach points 108 which are configured to accept a screw or a rivet in order to connect air guide 100 to a mounting surface. In one embodiment, air guide 100 is composed of sheet metal. In another embodiment air guide 100 is composed of plastic. Alternatively, air guide 100 can be composed of any rigid material and be of any shape that allows air to be focused from intake 102 to focused egress 106.

In the embodiment shown in FIGS. 1 and 2, intake 102 has a larger cross-section than focused egress 106. Cooling air 114 enters air guide 100 at intake 102 and is focused down through transition portion 104 to focused egress 106. As air guide 100 is shown in FIGS. 1 and 2, cooling air 114 is flowing through channel 110 on the underside of air guide 100. Transition portion 104 directs the air flow received by intake 102 of air guide 100 into focused egress 106. In one embodiment, transition portion 104 provides an evenly narrowing gradient from intake 102 to focused egress 106. Alternatively, any shape can be used to direct air from intake 102 to focused egress 106 as long as a main air flow from intake 102 is directed into focused egress 106.

Figure 3:
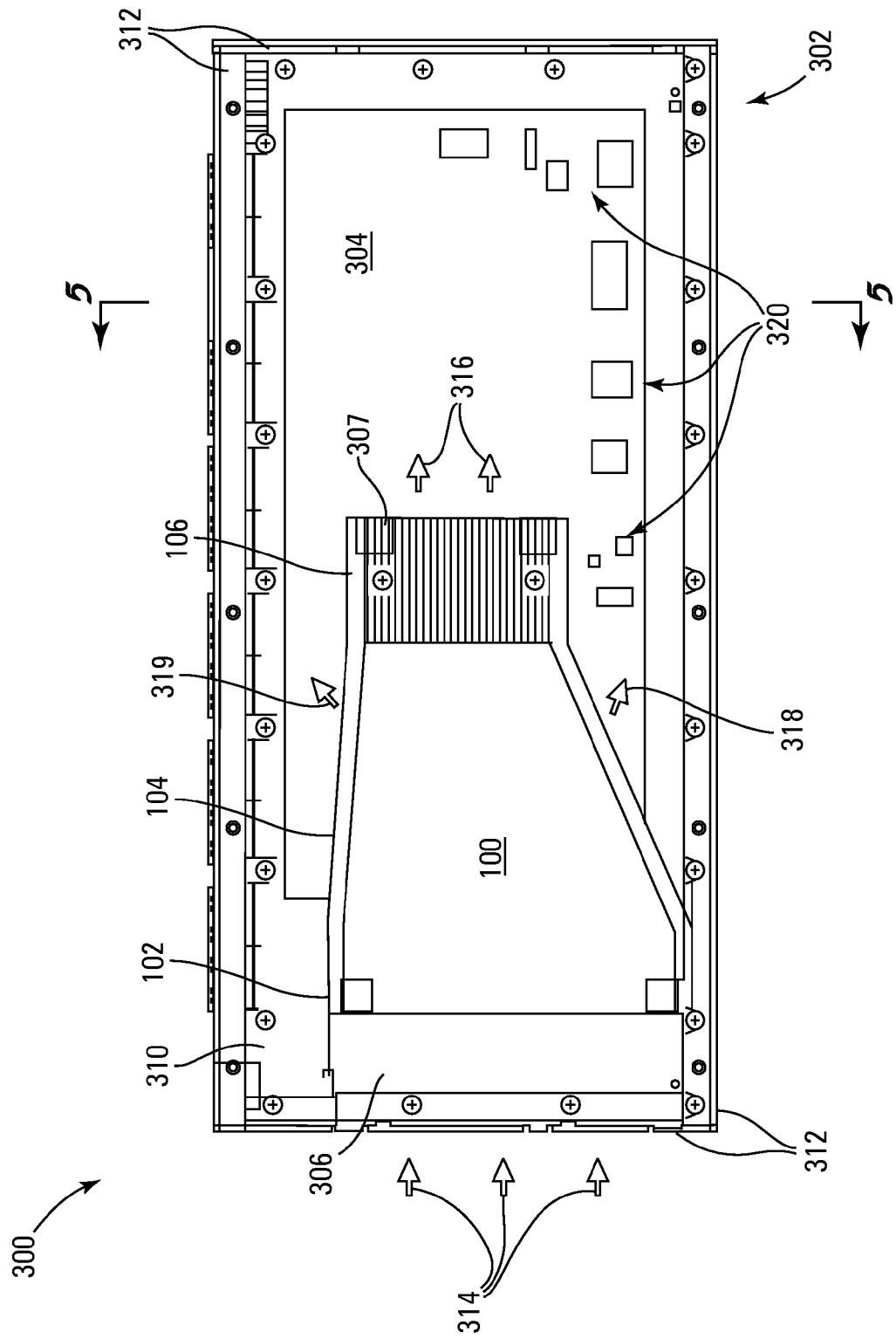
FIG. 3 is a top cross-sectional view of one embodiment of a system with the air guide of FIG. 1.

FIG. 3 shows a cross-section of one embodiment of air guide 100 in an electronic system 300. In FIG. 3, system 300 is shown as fully assembled. Furthermore, FIG. 3 is a view of system 300 looking down into a housing 302. This provides a top schematic view of system 300 with air guide 100 installed. System 300 also includes a circuit board 304, a fan assembly 306 and a heat sink 307. Housing 302 includes a removable top (shown in FIG. 4), a base 310, and four sides 312. Circuit board 304 is mounted to base 310 of housing 302 Heat sink 307 is mounted to an electronic chip 506 (shown in FIG. 5) on circuit board 304.

As stated above, intake 102 has a larger cross-section than focused egress 106. In one embodiment, the cross-section of intake 102 is shaped substantially similar to fan assembly 306. Thus, intake 102 directs substantially all of the air from fan assembly 306 into air guide 100. In one embodiment, intake 102 abuts, but does not connect to the exhaust side of fan assembly. In another embodiment, intake 102 covers and connects to fan assembly 306. In this embodiment, fan assembly 306 consists of multiple fans. In another embodiment, fan assembly 306 is single fan. In another embodiment of air guide 100, intake 102 has cross-section that is a plurality of semi-circles. In this embodiment, each semi-circle matches up with a corresponding fan from fan assembly 306. In yet another embodiment, intake 102 of air guide 100 is much larger than fan assembly 306. In this embodiment intake 102 is flush with or sealed to a side 312 of housing such that the air from fans is forced through air guide 100.

In operation, the main air flow of air guide 100 flows through channel 110 underneath air guide 100 as shown in FIG. 3. First, the fans of fan assembly 306 force cool air 314 through fan assembly 306 and into intake 102 of air guide 100. Cool air 314 then flows into transition portion 104 (air is flowing underneath air guide 100 as shown in FIG. 3). Transition portion 104 focuses most of cool air 314 into focused egress 106 and onto heat sink 307. Most of cooling air 314 flows through channel 110 and out a main path 316 through focused egress 106 and heat sink 307. Transition portion 104, however, allows some cooling air 314 to escape from channel 110 through a gap (shown in FIG. 5) between air guide 100 and circuit board 304. This escaping air flows along secondary paths 318, 319. The restricting shape of transition portion 104 and focused egress 106 forces a large amount of air through heat sink 307; increasing the heat dissipating ability of heat sink 307.

In one embodiment, the remainder of the air that does not flow through main path 316 escapes from channel 110 between a bottom edge of transition portion 104 and circuit board 304 and flows through secondary paths 318, 319. Secondary path 318 is used to cool secondary components 320. Thus, from a single fan assembly 306, air guide 100 focuses air flow onto heat sink 307, and allows some of the air flow to travel over secondary components 320. This increases the heat dissipation of heat sink 307, while still providing heat dissipation for secondary components 320.

To further increase heat dissipation of secondary components 320, secondary components 320 are positioned on circuit board 304 in the flow of air from secondary path 318. Secondary components 320 are positioned on circuit board 304 along the sides 312 of housing 302. The air released from secondary path 318 flows along sides 312 of housing 302. Thus, secondary components 320 are positioned along sides 312 of housing 302 such that secondary components 320 are in the flow of air from secondary path 318. Efficient cooling of secondary components 320 in system 300 is, therefore, achieved. Additionally, in this embodiment, there is a void of secondary components 320 on circuit board 304 in the area below air guide 100. The air flowing through transition portion is, therefore, not parasitically heated before passing through heat sink 307. Additionally, this allows for easier assembly of air guide 100 into system 300.

Figure 4:
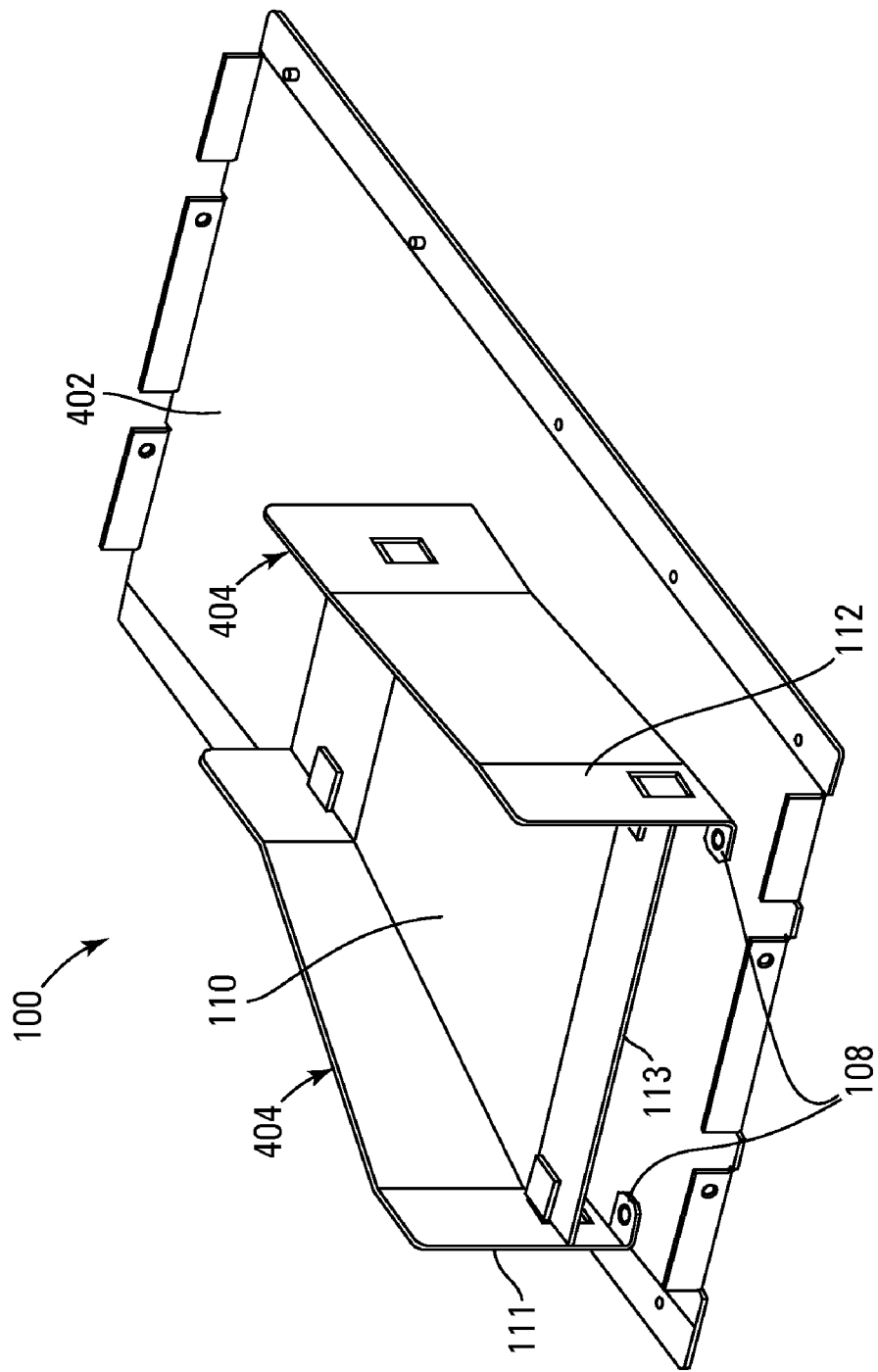
FIG. 4 is a perspective view of one embodiment of the air guide of FIG. 1 on a removable side of a housing.

FIG. 4 illustrates a bottom perspective view of air guide 100 mounted to removable top 402. Removable top 402 attaches to housing 302 to form an enclosed box. In one embodiment, air guide 100 is permanently attached to removable top 402 via attach points 108. When system 300 (including removable top 402) is fully assembled, removable top 402 is secured to sides 312 of housing 302. Air guide 100 is mounted to removable top 402, such that when removable top 402 is secured in position on housing 302 air guide 100 is in the position shown in FIGS. 3 and 5. Mounting air guide 100 to removable top 402 provides for easy insertion and removal of air guide 100. Additionally, access to circuit board 304 is achieved by removing removable top 402 and attached air guide 100. To remove air guide 100 from system 300, removable top 402 is detached from sides 312 of housing 302 (FIG. 3). Removable top 402 and attached air guide 100 are then lifted from system 300. In this embodiment, air guide 100 has two bottom edges 404, which are positioned relative to circuit board 304 as explained with reference to FIG. 5 below.

Figure 5:
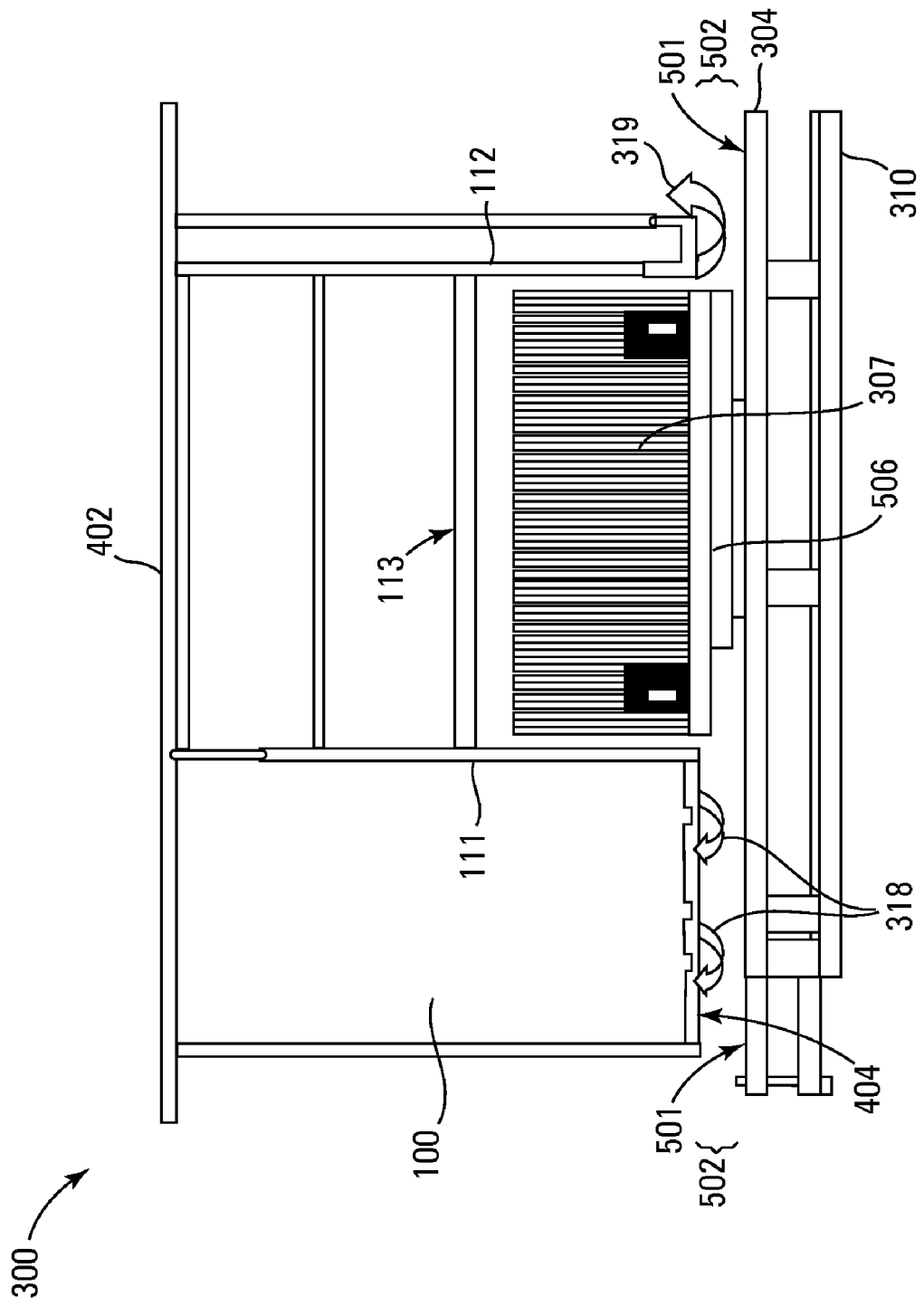
FIG. 5 is a cross-sectional view of one embodiment of the system of FIG. 3.

FIG. 5 shows a cross-sectional view of system 300 illustrating the one embodiment of the positioning of air guide 100 and circuit board 304. When installed in system 300, air guide 100 is positioned to form a gap 502 between bottom edges 404 of channel 110 and circuit board 304. Gap 502 allows air to flow through secondary paths 318, 319. Air guide 100 is attached to removable top 402, and is positioned above circuit board 304, which is attached to base 310 of housing 302. Air guide 100 is installed such that bottom edges 404 are substantially opposed to a surface 501 of circuit board 304. Thus, surface 501 of circuit board 304 acts to partially close channel 110 and direct air through transition portion 104 into focused egress 106. In this embodiment, bottom edges 404 are each positioned an equal distance in the range of 0.1 to 0.5 inches from surface 501. In another embodiment, bottom edges 404 are positioned at different distances from surface 501, thus letting differing amounts of air out either secondary path 318, 319 of channel 110. In yet another embodiment, only one of the bottom edges 404 of air guide 100 is spaced apart from circuit board 304, and the other bottom edge 404 abuts circuit board 304. Thus, one of the secondary paths (e.g. 319) is completely closed; increasing the air flow on the other secondary path (e.g. 318) and main path 316.

The size of gap 502 between bottom edges 404 and circuit board 304 can be designed larger or smaller to allow more or less air to flow respectively over secondary components 320. A larger gap 502 allows more air to pass over secondary components 320 and reduces the air flow into focused egress 106. In the embodiment shown in FIG. 5, bottom edges 404 are positioned close enough to circuit board 304 such that the majority of the air flow from intake 102 travels through transition portion 104 and into focused egress 106. In one embodiment, bottom edges 404 are two (2) tenths of an inch from surface 501.

In this embodiment, focused egress 106 of air guide 100 has a shape substantially similar to heat sink 307. Shaping focused egress 106 of air guide 100 similar to heat sink 307 forces substantially all of the air flow of channel 110 through heat sink 307. Focused egress 106 has a slightly larger cross-section than heat sink 307 allowing for easier insertion and removal of air guide 100.

In another embodiment, air guide 100 mounts to base 310 of housing 304 instead of removable top 402 and has a plurality of feet which space bottom edges 404 from surface 501 and form gap 502. In this embodiment, the feet of air guide 100 are sufficiently narrow such that gap 502 is insignificantly obstructed. In this embodiment, the height of the feet is adjusted to increase or decrease the size of gap 502.

Figure 6:
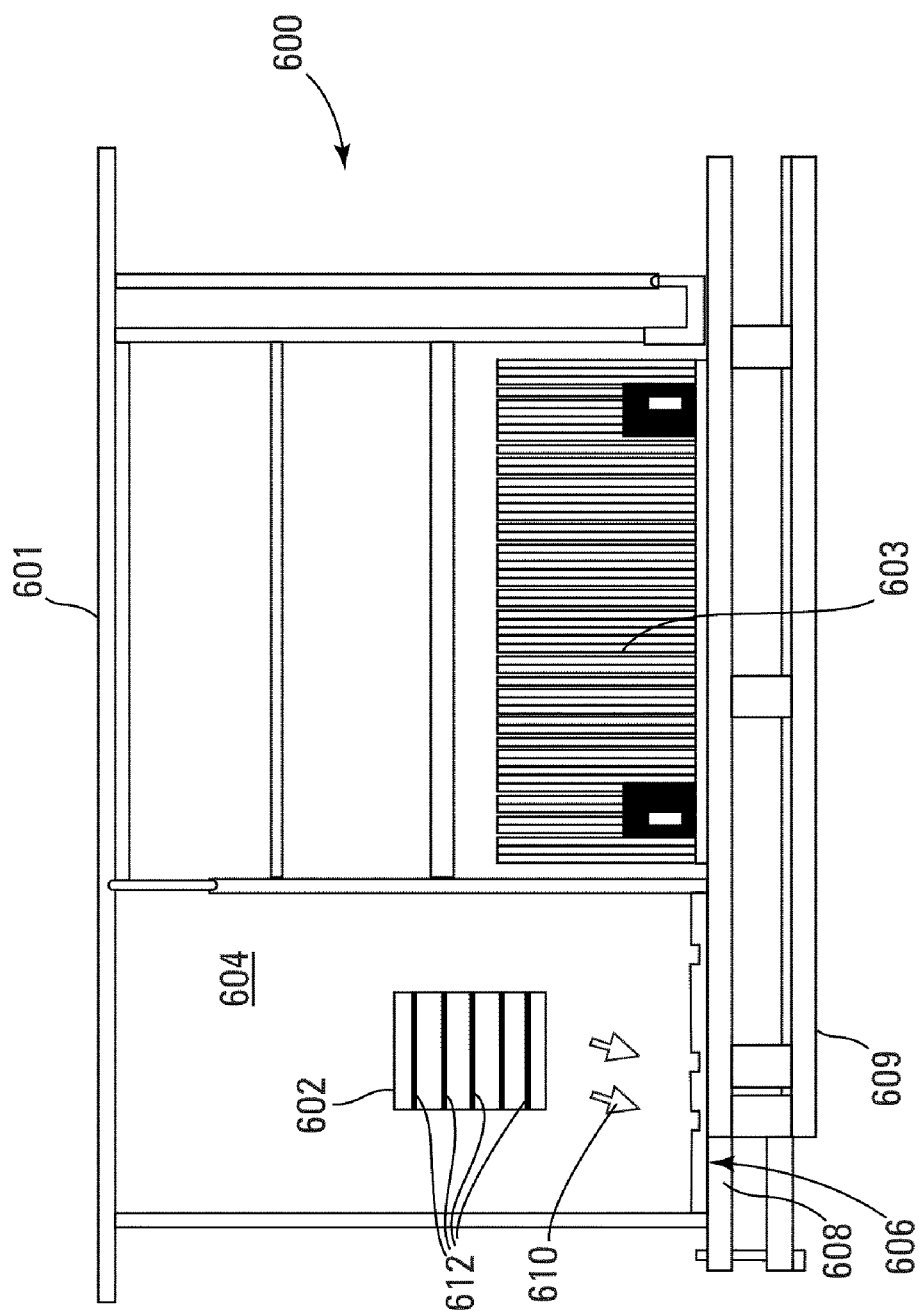
FIG. 6 is a cross-sectional view of another embodiment of a system with an air guide.

FIG. 6 illustrates another embodiment of an air guide 600. In this embodiment, air guide 600 also mounts to a removable top 601 of a housing and fits around a heat sink 603. In this embodiment, air guide 600 defines a slot 602 in the side of transition portion 604. Additionally, air guide 600 is installed such that bottom edge 606 is flush with a circuit board 608. Circuit board 608 is attached to a base 609. Here, a secondary path 610 for air flow is formed by slot 602. In this embodiment, slot 602 has a plurality of louvers 612 to further direct the air flow down toward circuit board 608. In another embodiment, louvers 612 are vertical and are angled to direct air sideways from air guide 600. Alternatively, louvers 612 can be angled in any direction as desired to direct the air flow. The size and number of slots 602 can be adjusted to provide more or less air flow through secondary path 610. In another embodiment of air guide 600, transition portion 604 has multiple slots 602. In yet another embodiment, slot 602 of air guide 600 is cut in from bottom edge 606 of transition portion 604. Thus, bottom edge 606 of transition portion 604 is not flat and slot 602 forms a gap between a portion of bottom edge 606 and circuit board 608. In still another embodiment, air guide 600 has an enclosed tube shape in which the tube directs air flow from the intake (not shown) of air guide 600, through transition portion 604 and into focused egress of air guide 600. In another embodiment, air guide 600 is installed forming a gap similar to FIG. 5 and also includes a slot 602 to increase air flow in the area of secondary components 320.

FIG. 7 illustrates yet another embodiment of an air guide 700. Similar to air guide 100, air guide 700 has an intake 702, a transition portion 704, a focused egress 706, and attach points 708. Air guide 700 also has an elongated tube 710 extending out from transition portion 704. Elongated tube 710 provides a secondary path 712 for air flow from air guide 700. Elongated tube 710 allows secondary path 712 to be directed in a more precise direction. In one embodiment, elongated tube 710 directs air directly onto a heat sink of a secondary component. In another embodiment, elongated tube 710 directs air in a general direction of a secondary component.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An apparatus for guiding air to electronic components comprising:
    an intake having a vertically extending cross-section;
    a transition portion connected at a first end to the intake and defining a channel having a generally 'u' shaped cross-section, an open side of the channel having a first edge and a second edge configured to be positioned substantially opposing a surface, wherein at least the first edge is positioned a distance away from the surface forming a gap between the first edge and the surface, such that air flow is directed towards secondary electronic components; and
    a focused egress having a vertically extending cross-section and connected to a second, opposed end of the transition portion such that air flow is directed substantially horizontally towards a primary electronic component;
    wherein the gap extends from the intake to the focused egress along a length of the transition portion.

2. The apparatus of claim 1, wherein the first edge and the second edge of the transition portion are positioned a distance in the range of 0.1 to 0.5 inches away from the surface.

3. The apparatus of claim 1, wherein the intake has a shape that substantially matches a fan assembly.

4. The apparatus of claim 1, wherein the focused egress has a shape that substantially matches a cross section of a heat sink.

5. The apparatus of claim 1, wherein the apparatus is composed of metal.

6. The apparatus of claim 1, wherein the apparatus is composed of plastic.

7. The apparatus of claim 1, wherein the transition portion defines a slot.

8. The apparatus of claim 7, wherein the transition portion further defines at least one louver within the slot.

9. The apparatus of claim 1, further comprising an elongated tube connected to the transition portion.

10. A system for guiding air to electronic components comprising:
    a housing having a base and a removable side;
    a circuit board attached to base of the housing;
    at least one fan attached to the housing; an intake having a vertically extending cross-section, and located adjacent to the at least one fan;
    an air guide attached to the removable side and having a generally 'u' shaped cross-section, an open side of the generally 'u' shaped air guide having a first edge and a second edge configured to be positioned substantially opposing a surface, wherein at least the first edge is positioned a distance away from the surface forming a secondary air flow between the first edge and the surface;
    an electronic chip attached to the circuit board;

a heat sink attached to the electronic chip, wherein the air guide directs a primary air flow substantially horizontally toward the heat sink via a focused egress having a vertically extending cross-section; and secondary components positioned in the secondary air flow;

wherein the secondary air flow extends from the at least one fan to the heat sink along a length of the air guide.

11. The system of claim 10, wherein the surface is on the circuit board.

12. The system of claim 10, wherein the:

focused egress has a shape that substantially matches the heat sink.

13. The apparatus of claim 10, wherein the first edge and the second edge of the transition portion are positioned a distance in the range of 0.1 to 0.5 inches away from the surface.

14. An apparatus for guiding air to electronic components comprising:

an intake having a vertically extending cross-section configured to receive air flow from at least one fan;

a transition portion attached at a first end to the intake;

a focused egress having a vertically extending cross-section and attached to a second opposed end of the transition portion; and wherein the transition portion is configured to direct most of the air flow substantially horizontally from the intake to the focused egress, and the transition portion allows a secondary electronic portion of the air flow to escape from the main air flow and flow over a secondary electronic component, wherein the transition portion directs most air flow down a generally 'u' shaped channel, and allows a secondary portion of the air flow to escape between a first edge of the channel and a surface, the secondary air flow extending from the intake to the focused egress along a length of the transition portion.

15. The apparatus of claim 14, wherein the first edge of the transition portion is positioned a distance in the range of 0.1 to 0.5 inches away from the surface.

16. The apparatus of claim 14, wherein the apparatus is attached to a removable side of a housing.

17. The apparatus of claim 14, wherein the intake has a shape that substantially matches a fan assembly.

18. The apparatus of claim 14, wherein the focused egress has a shape that substantially matches a cross section of a heat sink.

19. The apparatus of claim 14, wherein the apparatus is composed of metal.

20. The apparatus of claim 14, wherein the apparatus is composed of plastic.

21. The apparatus of claim 14, wherein the transition portion defines a slot.

22. The apparatus of claim 21, wherein the transition portion further defines at least one louver within the slot.

23. The apparatus of claim 14, further comprising an elongated tube connected to the transition portion.

* * * * *